(12) United States Patent
Park et al.

(10) Patent No.: US 11,937,389 B2
(45) Date of Patent: Mar. 19, 2024

(54) LATCH ASSEMBLIES FOR ELECTRONIC DEVICES

(71) Applicant: Hewlett-Packard Development Company, L.P., Spring, TX (US)

(72) Inventors: Chan Woo Park, Spring, TX (US); Chung Hua Ku, Taipei (TW); Kuo Chih Huang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 215 days.

(21) Appl. No.: 17/770,063

(22) PCT Filed: Nov. 5, 2019

(86) PCT No.: PCT/US2019/059737
§ 371 (c)(1),
(2) Date: Apr. 19, 2022

(87) PCT Pub. No.: WO2021/091529
PCT Pub. Date: May 14, 2021

(65) Prior Publication Data
US 2022/0394869 A1    Dec. 8, 2022

(51) Int. Cl.
*H05K 5/02* (2006.01)
(52) U.S. Cl.
CPC .................. *H05K 5/0221* (2013.01)
(58) Field of Classification Search
CPC ....................................................... H05K 5/00
See application file for complete search history.

(56) References Cited

U.S. PATENT DOCUMENTS

| 5,116,261 | A | 5/1992 | Lan et al. | |
|---|---|---|---|---|
| 6,385,036 | B1 | 5/2002 | Chien | |
| 8,252,067 | B2 | 8/2012 | Farrow et al. | |
| 2008/0198542 | A1* | 8/2008 | Kim | G06F 1/1679 |
| | | | | 361/679.55 |
| 2014/0084762 | A1* | 3/2014 | Lai | H04M 1/0249 |
| | | | | 403/326 |
| 2018/0129251 | A1 | 5/2018 | Gault et al. | |

FOREIGN PATENT DOCUMENTS

| CN | 203934187 U | 11/2014 |
|---|---|---|
| EP | 3136694 A1 | 3/2017 |
| KR | 10-2001-0045258 A | 6/2001 |

* cited by examiner

*Primary Examiner* — Jerry Wu
(74) *Attorney, Agent, or Firm* — Knobbe, Martens, Olson & Bear, LLP

(57) ABSTRACT

In one example, an electronic device housing may include a first cover, a second cover, and a latch assembly to detachably connect the first cover and the second cover. The latch assembly may include a first bracket to fixedly engage with the first cover, a latch to slide back and forth along the first bracket between a lock position to hold the second cover and an unlock position to release the second cover, an elastic member disposed between the latch and the first bracket to generate a force to the latch to hold the second cover, and a cable connected to the latch. The cable may generate a pulling force to the latch to release the second cover when an external force is applied to the cable.

13 Claims, 6 Drawing Sheets

LATCH ASSEMBLIES FOR ELECTRONIC DEVICES

BACKGROUND

Fasteners such as screws, nuts, and the like may be used to join various components together in a variety of applications. Example components may include a top cover and a bottom cover that form an enclosure of an electronic device. Example electronic devices may include laptop computers, tablet computers, convertible devices, mobile phones cameras, personal digital assistants, and the like. The top cover and the bottom cover may be coupled using the fasteners.

BRIEF DESCRIPTION OF THE DRAWINGS

Examples are described in the following detailed description and in reference to the drawings, in which.

DETAILED DESCRIPTION

Fasteners such as screws, nuts, and the like may be used to join various components together in a variety of applications. However, using fasteners to secure a part having an exterior cosmetic surface may result in a visible opening or at least a fastener head being visible after the product is assembled. The exposed fasteners may affect the aesthetic appearance of the product such as a notebook computer, a tablet computer, a mobile device, a camera, or any other product having components connected using the fasteners. Further, in some examples, the visibility of an external fastener may also allow to access components disposed within a device housing. In devices involving tamper resistance, a readily visible fastener can be undesirable. Also, the assembly and disassembly process using the fasteners may be cumbersome as the fasteners can be slipped.

Examples described herein may provide an, electronic device housing including a first cover, a second cover, and a latch assembly to detachably connect the first cover and the second cover. In one example, the latch assembly may include a first bracket to fixedly engage with the first cover. Further, the latch assembly may include a latch to slide back and forth along the first bracket between a lock position to hold the second cover and an unlock position to release the second cover. Furthermore, the latch assembly may include an elastic member disposed between the latch and the first bracket to generate a force to the latch to hold the second cover. In addition, the latch assembly may include a cable connected to the latch. The cable may generate a pulling force to the latch to release the second cover when an external force is applied to the cable.

Thus, examples described herein may improve the aesthetic appearance of the electronic devices due of screwless connection between the first cover and the second cover. Further, examples described herein may enhance safety of the electronic device as customized external tools can be used to separate the first cover and the second cover. Furthermore, examples described herein may save assembling/disassembling cycle time of the first and second covers due to the screwless connection.

In the following description, for purposes of explanation, numerous specific details are set forth in order to provide a thorough understanding of the present techniques. It will be, apparent, however, to one skilled in the art that the present apparatus, devices and systems may be practiced without these specific details. Reference in the specification to "an example" or similar language means that a particular feature, structure, or characteristic described may be included in at least that one example, but not necessarily in other examples.

Figure 1A:
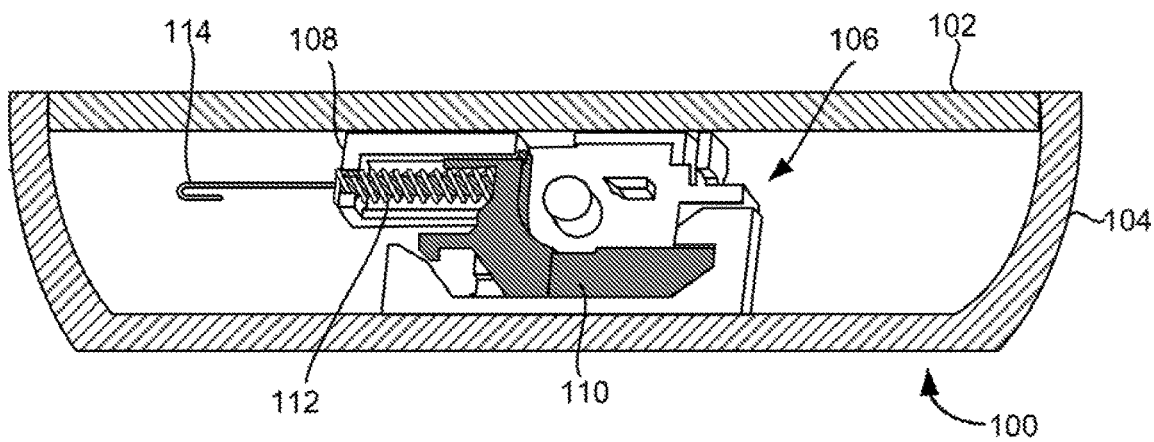
FIG. 1A is a cross-sectional side view of an example electronic device housing, depicting a latch assembly to detachably connect a first cover and a second cover.

Referring now to the figures, FIG. 1A is a cross-sectional side view of an example electronic device housing 100, depicting a latch assembly 106 to detachably connect a first cover 102 and a second cover 104. Particularly, FIG. 1A is a cross-sectional view of example electronic device housing 100, depicting first cover 102 and second cover 104 in an assembled position. For example, latch assembly 106 may be used to connect components such as casings of an electronic device. In other examples, latch assembly 106 may also be used to connect any two parts such as to connect machine parts.

Electronic device housing 100 may include first cover 102, second cover 104, and latch assembly 106 to detachably connect first cover 102 and second cover 104. In this example, second cover 104 can be fastened to first cover 102 and can be detachable from first cover 102. For example, first cover 102 and second cover 104 may be connected to form electronic device housing 100 (e.g., an enclosure) of an electronic device. Example electronic device may include, but not limited to, a laptop, a convertible device, a personal digital assistance (PDA), a notebook, a sub-notebook, a personal gaming device, a camera, a mobile phone, or any other device that may house electronic components. Example convertible device may refer to a device that can be "converted" from a laptop mode to a tablet mode.

Example electronic device housing 100 may be a keyboard housing, a display housing, or the like. For example, the keyboard housing may house a keyboard, a battery, a touchpad, and so on. The display housing may house a display (e.g., a touchscreen display). Example display may include liquid crystal display (LCD), light emitting diode (LED), electro-luminescent (EL) display, or the like. In other examples, electronic device housing 100 may house other components such as a camera, audio/video devices and the like, depending on the functions of the electronic device.

For example, a notebook computer may include a keyboard housing and a display housing. The display housing may be formed by combining A-cover and B-cover and the keyboard housing may be formed by combining C-cover and D-cover. In this example, A-cover and B-cover or C-cover and D-cover may be combined using latch assembly 106.

Latch assembly 106 may include a first bracket 108 to fixedly engage with first cover 102. Further, latch assembly 106 may include a latch 110 to slide back and forth along first bracket 108 between a lock position to hold second cover 104 and an unlock position to release second cover 104. In this example, latch 110 may be slidably disposed on first bracket 108. Latch 110 may connect first cover 102 and second cover 104 in the lock position and detach/separate first cover 102 and second cover 104 in the unlock position. In one example, latch 110 may enable second cover 104 to connect with first cover 102 by way of a press fit.

Furthermore, latch assembly 106 may include an elastic member 112 disposed between latch 110 and first bracket 108 to generate a force to latch 110 to hold second cover 104. Example elastic member 112 may be a spring (e.g., a compression spring). In some examples, elastic member 112 may have any other structure and configurations while ensuring the function of elastic member 112. Elastic member 112 may provide a thrust (e.g., restoring force) to latch 110 to ensure that latch 110 returns to an original position when no force is applied to latch 110.

Also, latch assembly 106 may include a cable 114 connected to latch 110. Example cable 114 may include metal such as aluminum, copper, and the like. Cable 114 may generate a pulling force to latch 110 to release second cover 104 when an external force is applied to cable 114. An example latch mechanism may be explained in FIGS. 2A-2D. In some examples, elastic member 112 may generate the force to latch 110 to return latch 110 to the original position when second cover 104 is separated from first cover 102 or when no force is applied to latch 110.

Figure 1B:
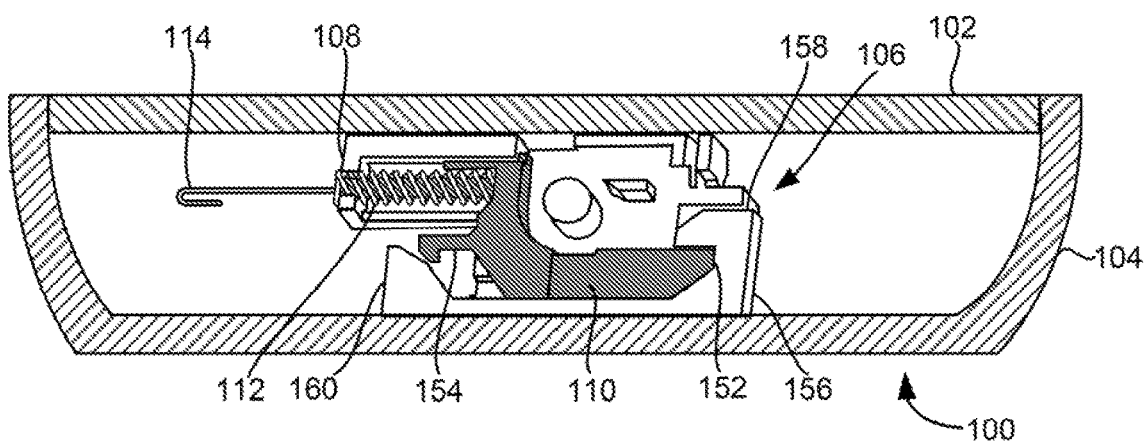
FIG. 1B is a cross-sectional side view of the example electronic device housing of FIG. 1A, depicting additional features.

FIG. 1B is a cross-sectional side view of example electronic device housing 100 of FIG. 1A, depicting additional features. For example, similarly named elements of FIG. 1B may be similar in structure and/or function to elements described with respect to FIG. 1A. As shown in FIG. 1B, latch 110 may include a lock portion 152 to hold second cover 104 to connect first cover 102 and second cover 104 when latch 110 is in the lock position. Further, latch 110 may include a hook portion 154 to hold second cover 104 in place to facilitate disengaging of first cover 102 and second cover 104 when latch 110 is in the unlock position.

Furthermore, latch assembly 106 may include a second bracket 156 to fixedly engage with second cover 104. In one example, second bracket 156 can be formed on an inner surface of second cover 104 as an integral part during a molding process of second cover 104. In other examples, second bracket 156 may be a separate component and can be fixedly disposed on the inner surface of second cover 104 using a fastener, adhesive, or the like. As shown in FIG. 1B, second bracket 156 may include a first portion 158 to engage with lock portion 152 of latch 110 in the lock position. Further, second bracket 156 may include a second portion 160 to engage with hook portion 154 in the unlock position.

Figure 2A:
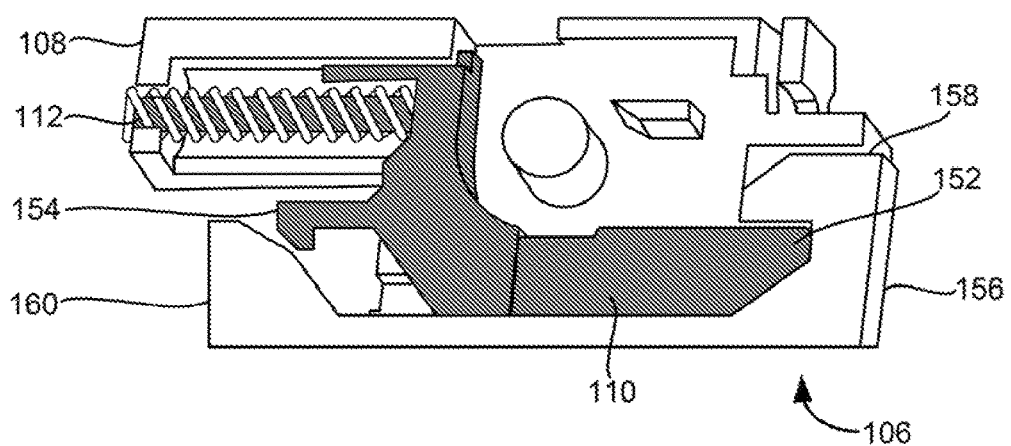
FIGS. 2A-2D depict schematic diagrams illustrating a latch mechanism of the example latch assembly of FIG. 1A, to couple and, decouple the first cover and the second cover.

FIs. 2A-2D depict schematic diagrams illustrating a latch mechanism of example latch assembly 106, to couple and decouple first cover 102 and second cover 104 (e.g., as shown in FIGS. 1A and 1B). For example, similarly named elements of FIGS. 2A-2D may be similar in structure and/or function to elements described with respect to FIGS. 1A and 1B. As shown in FIG. 2A, lock portion 152 of latch 110 may hold second cover 104 (e.g., as shown in FIG. 1A) to connect first cover 102 (e.g., as shown in FIG. 1A) and second cover 104 when latch 110 is in the lock position. In this example, elastic member 112 may provide thrust/force to latch 110 such that lock portion 152 may engage with first portion 158 to connect first cover 102 and second cover 104.

Figure 2B:
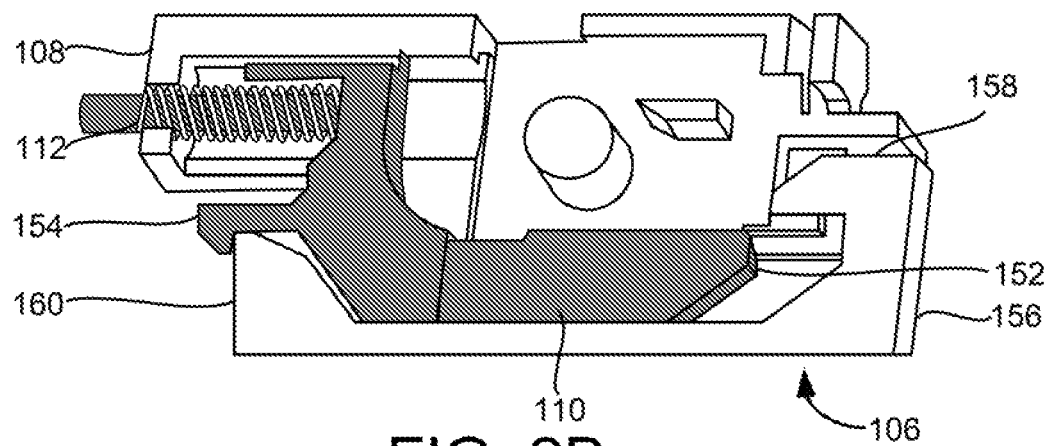
Figure 2C:
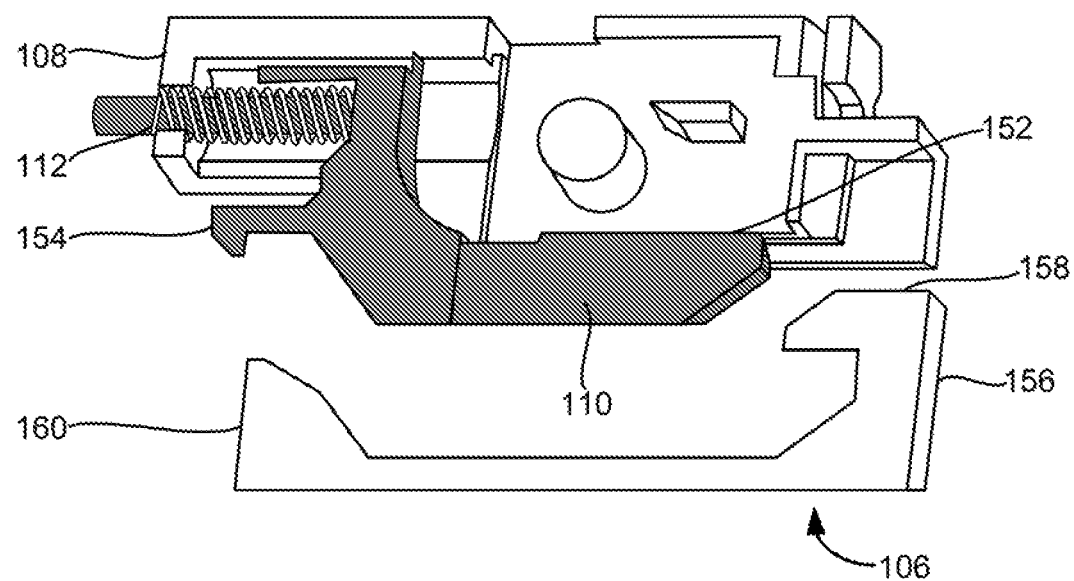
Figure 2D:
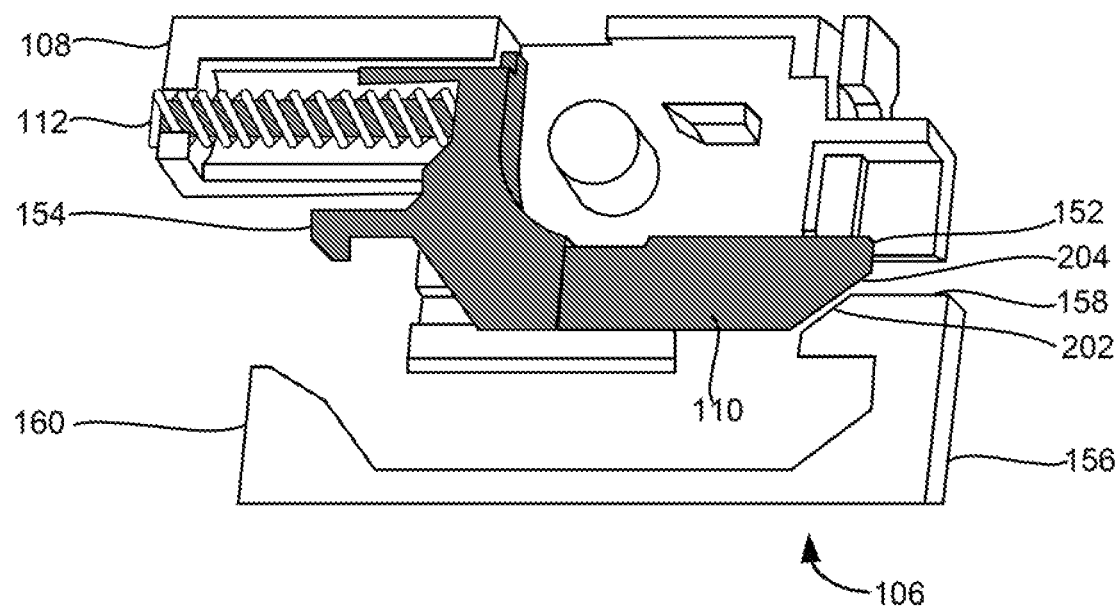

FIG. 2B depicts an example schematic diagram illustrating a mechanism to pull latch 110 to the unlock position to decouple first cover 102 and second cover 104. When cable 114 (e.g., as shown in FIGS. 1A and 1B) is pulled using an external tool, latch 110 may slide to the unlock position via compression of elastic member 112 and lock portion 152 may disengage from first portion 158. Further, hook portion 154 of latch 110 may hold second portion 160 of second bracket 156 such that latch 110 may stay in the unlock position until second cover 104 is detached from first cover 102, as shown in FIG. 2B. As shown in FIG. 2C, second cover 104 can be detached from first cover 102 via pulling or sliding out second cover 104 away from first cover 102. When second cover 104 is detached from first cover 102, elastic member 112 may decompress to return latch 110 to an original position (i.e., the lock position), as shown in FIG. 2D.

Further, second cover 104 may connect with first cover 102 by way of a press fit. To enable press fit, first portion 158 of second bracket 156 may include a first slide surface 202 and lock portion 152 of latch 110 may include a second slide surface 204. During press fitting of first cover 102 and second cover 104, first slide surface 202 may abut second slide surface 204 such that latch 110 may slide towards the unlock position via compression of elastic member 112. Upon lock portion 152 engages with first portion 158, latch 110 may return to the original position due to decompression of elastic member 112 to lock and hold second cover 104 in position. Lock portion 152 and first portion 158 can be of any structure such that an effect of latch 110 and second cover 104 being locked and fixed may be achieved during connection of first cover 102 and second cover 104.

Figure 3A:
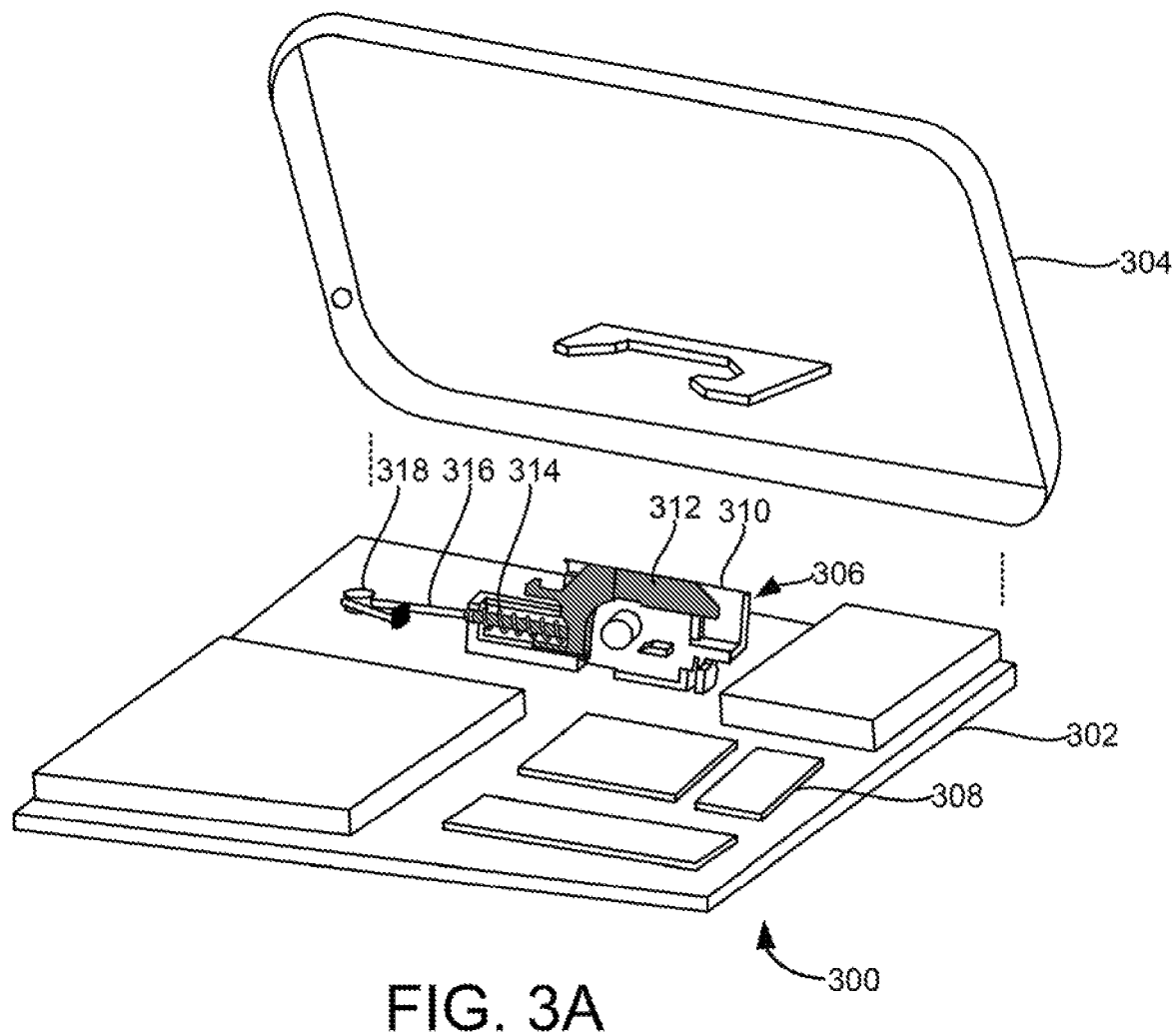
FIG. 3A is a perspective view of an example electronic device, depicting a latch assembly to connect a rear cover to a main body.

FIG. 3A is a perspective view of an example electronic device 300, depicting a latch assembly 306 to connect a rear cover 304 to a main body 302. Electronic device 300 may include main body 302 including an electronic component 308. Particularly, FIG. 3A is a perspective view of example electronic device 300, depicting main body 382 and rear cover 384 in a detached position. For example, main body 302 may include a casing and electronic component coupled to the casing. Further, electronic device 300 may include rear cover 304 that can be connected to main body 302 to house electronic component 308. Furthermore, electronic device 300 may include latch assembly 306 to detachably connect rear cover 304 to main body 302.

In one example, latch assembly 306 may include, a first bracket 310 to fixedly engage with main body 302. Further, latch assembly 306 may include a latch 312 to slide back and forth along first bracket 310 between a lock position to hold rear cover 304 and an unlock position to release rear cover 304. In this example, latch 312 may be slidably disposed on first bracket 310. Latch 312 may engage with rear cover 304 so that main body 302 can be relatively fixed with rear cover 304 through latch 312. Furthermore, latch assembly 306 may include an elastic member 314 disposed between latch 312 and first bracket 310 to generate a force to latch 312 to hold rear cover 304.

Further, latch assembly 306 may include a cable 316 having a first end connected to latch 312. In addition, electronic device 300 may include a pulley 318 disposed in main body 302 to change a direction of cable 316. During operation, cable 316 may generate a pulling force to latch 312 (e.g., to move latch 312 to the unlock position) to release rear cover 384 from main body 302 when cable 316 is pushed using an external tool. In this example, pulley 318 may change a direction of movement of cable 316 such that cable 316 can actuate latch 312 in a first direction when cable 316 is pushed using the external tool in a second direction. The second direction can be opposite to the first direction. In other examples, the second direction can be perpendicular to the first direction.

Figure 3B:
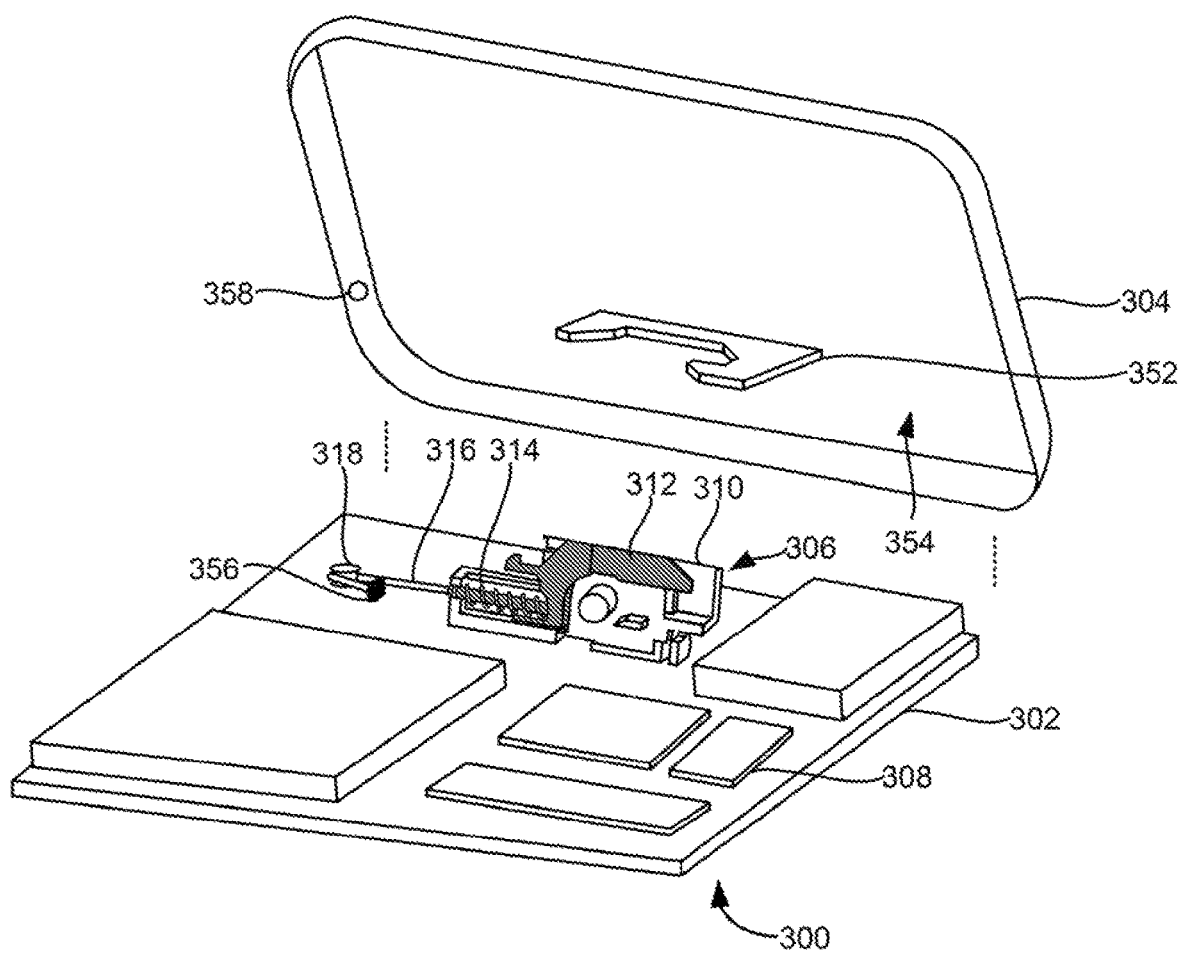
FIG. 3B is a perspective vie of the example electronic device of FIG. 3A, depicting additional features.

FIG. 3B is a perspective view of example electronic device 300 of FIG. 3A, depicting additional features. For example, similarly named elements of FIG. 3B may be similar in structure and/or function to elements described with respect to FIG. 3A. As shown in FIG. 3B, latch assembly 306 may include a second bracket 352 to fixedly engage with rear cover 304 such that latch 312 can hold rear cover 304 via second bracket 352. Rear cover 304 may include an inner surface 354 and second bracket 352 may protrude from inner surface 354. In one example, second bracket 352 may be engageable with latch assembly 306 to couple rear cover 304 to main body 302.

Further, latch assembly 306 may include an actuator 356 connected to a second end of cable 316. For example, actuator 356 may be slidably mounted in main body 302 to facilitate pushing/pulling of cable 316 using an external tool. In one example, actuator 356 can be pushed using the external tool to provide the pulling force to latch 312. The pulling force may separate latch 312 from rear cover 304. As shown in FIG. 3B, latch assembly 306 including cable 316 may be located inside main body 302 and can be accessed using external tools. In some examples, main body 302 may include a lock structure corresponding to an opening 358 in a sidewall of rear cover 304 such that external tool can be inserted into opening 358 and guided through lock structure to push cable 316 as shown in FIGS. 4A and 4B.

Figure 4A:
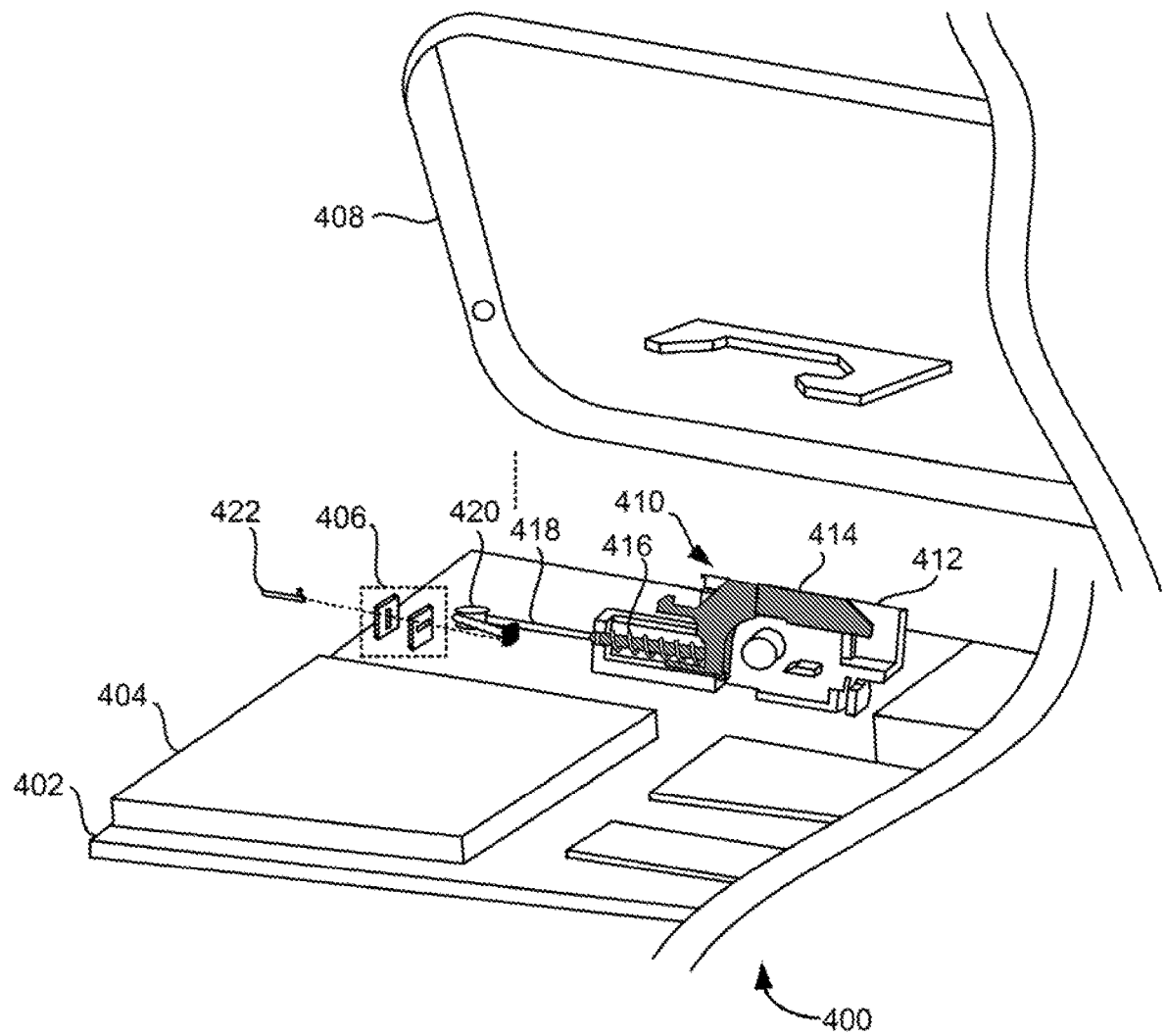
FIG. 4A is a perspective view of a portion of an example electronic device, depicting a lock structure through which a latch assembly can be accessed using an external tool.
Figure 4B:
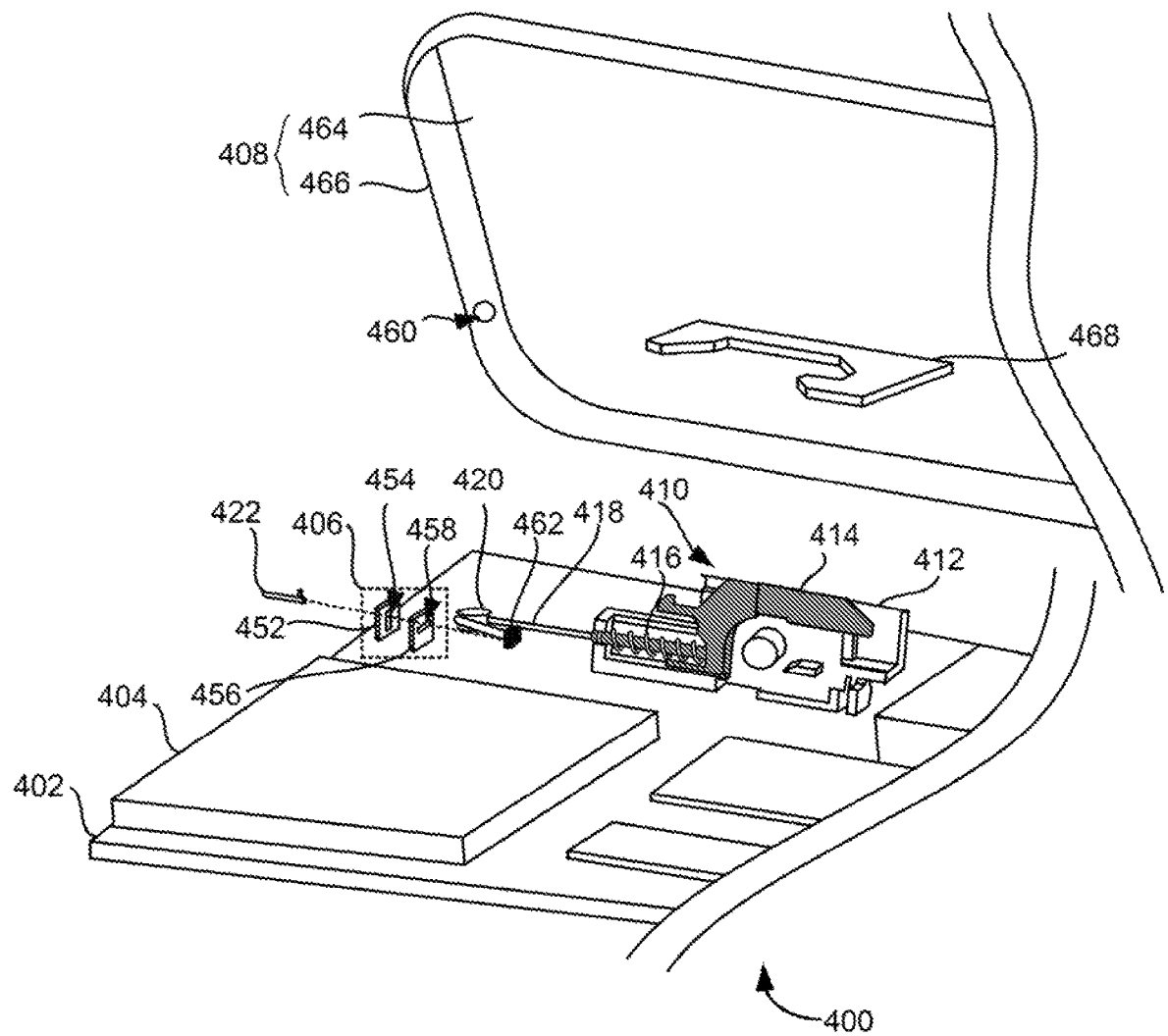
FIG. 4B is a perspective view of the portion of the example electronic device of FIG. 4A, depicting additional features.

FIG. 4A is a perspective view of a portion of an example electronic device 400, depicting a lock structure 406 through which a latch assembly 410 can be accessed using an external tool 422. As shown in FIG. 4A, electronic device 400 may include a main body 402. Main body 402 may include an electronic component 404. Example electronic component 404 may be a mother board, a processor, a memory, a keyboard, a battery, a touchpad, a display, a camera, an audio/video device, and the like, depending on the functions of electronic device 400.

Main body 402 may include lock structure 406. Example lock structure 406 may be described in FIG. 4B. Further, electronic device 400 may include a rear cover 408 that may cooperate with main body 402 to form a receiving space for receiving electronic component 404. Further, electronic device 400 may include latch assembly 410 to detachably connect rear cover 408 to main body 402.

In one example, latch assembly 410 may include a first bracket 412 to fixedly engage with main, body 402. Further, latch assembly 410 may include a latch 414 to slide back and forth along first bracket 412 between a lock position to hold rear cover 408 and an unlock position to release rear cover 408. Furthermore, latch assembly 410 may include an elastic member 416 disposed between latch 414 and first bracket 412 to generate a force to latch 414 to hold rear cover 408. For example, elastic member 416 may be disposed on a shaft portion of latch 414 and fixedly engaged with first bracket 412 to compress/decompress during sliding of latch 414 along first bracket 412.

Also, latch assembly 410 may include a cable 418 having a first end connected to latch 414. Further, electronic device 400 may include a pulley 420 disposed in main body 402 to change a direction of cable 418. When cable 418 is pushed through lock structure 406 using external tool 422, cable 418 may generate a pulling force to latch 414 to release rear cover 408 from main body 402. In this example, external tool 422 may be a designed key that can access/cooperate with lock structure 406. In some examples, external tool 422 can be customized with characteristics such as key quantities, key dimensions, key angles, key shapes and the like, to facilitate tamper proof attachment of rear cover 408 and main body 402.

FIG. 4B is a perspective view of the portion of example electronic device 400 of FIG. 4A, depicting additional features. For example, similarly named elements of FIG. 4B may be similar in structure and/or function to elements described with respect to FIG. 4A. As shown in FIG. 4B, example lock structure 406 may include a first internal wall 452 having a first locking slot 454 and a second internal wall 456 having a second locking slot 458. Second locking slot 458 may be disposed adjacent to first locking slot 454 and second locking slot 458 may connect with first locking slot 454. First locking slot 454 and second locking slot 458 may be used to be inserted by external tool 422 to push cable 418. In other examples, different slot designs can be used in different hock structures such that the lock structures can be accessed using corresponding unique external tools.

As shown in FIG. 4B, rear cover 408 may include an opening 460 corresponding to lock structure 406 such that external tool 422 can be inserted into opening 460 and guided through lock structure 406 to push cable 418. Example external tool 422 may include a Kensington lock. Example first locking slot 454 and second locking slot 458 may include a Kensington locking slot that cooperates with Kensington lock.

Further, latch assembly 410 may include an actuator 462 connected to a second end of cable 418. In one example, actuator 462 may be pushed through lock structure 406 using external tool 422 to provide the pulling force to latch 414. In the example shown in FIG. 4B, external tool 422 can be inserted through opening 460 and through first, locking slot 454. When external tool 422 hits second internal wall 456, then external tool 422 can be rotated to pass through second locking slot 458 and to push actuator 462.

In the example shown in FIG. 4B, rear cover 408 may include a base 464 and a sidewall 466 formed as a part of base 464. In this example, opening 460 may be formed in sidewall 466. In other examples, a sidewall may be formed as a part of main body 402 and an opening to access lock structure 406 and latch assembly 410 can be formed in the sidewall of main body 402. In other examples, lock structure 406 and latch assembly 410 can also be accessed using slots provided for sockets such as data jacks and power jacks, and/or slots provided for security. Further as shown in FIG. 4B, second bracket 468 may be fixedly engaged with rear cover 408 such that to latch assembly 410 may hold rear cover 408 via second bracket 468.

Thus, examples described herein may improve the aesthetic appearance of the electronic device housings and/or any other structures as no parts of latch assemblies can be exposed after installation and also provide an enhanced connection strength between the first cover and the second cover. Also, examples described herein may enhance the serviceability and/or service life of the electronic devices.

With the examples described, herein, electronic devices car be secured and hence specially designed external tools (e.g., keys) can be used to access the lock structures to detach the rear cover. Therefore, examples described herein may enhance safety of internal components of the electronic devices and hence can be applicable in electronic devices having confidential use cases. With specially designed keys, the rear cover can be detached in one step process (i.e., via pulling the latch), thereby saving service time and/or cost.

It may be noted that the above-described examples of the present solution are for the purpose of illustration only. Any modifications, equivalent replacements, and improvements made within the spirit and principles of the above-described examples should be included in the present solution and are within the scope of protection. Although the solution has been described in conjunction with a specific embodiment thereof, numerous modifications may be possible without materially departing from the teachings, and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on," as used herein, means "based at least in part on." Thus, a feature that is described as, based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. An electronic device housing comprising: a first cover; a second cover; and a latch assembly to detachably connect the first cover and the second cover, the latch assembly comprising: a first bracket to fixedly engage with the first cover; a latch to slide back and forth along the first bracket between a lock position to hold the second cover and an unlock position to release the second cover; an elastic member disposed between the latch and the first bracket to generate a force to the latch to hold the second cover; and a cable connected to the latch, wherein the cable is to generate a pulling force to the latch to release the second cover when an external force is applied to the cable; and the latch further comprises: a lock portion to hold the second cover to lock the first cover and the second cover when the latch is in the lock position; and a hook portion to hold the second cover in place to disengage the first cover and the second cover when the latch is in the unlock position; and the latch assembly further comprises a second bracket to fixedly engage with the second cover, and wherein the second bracket comprises: a first portion to engage with the lock portion of the latch in the lock position; and a second portion to engage with the hook portion in the unlock position.

2. The electronic device housing of claim 1, wherein the elastic member is to generate the force to the latch to return the latch to an original position when the second cover is separated from the first cover.

3. The electronic device housing of claim 1, wherein the latch is to enable the second cover to connect with the first cover by way of a press fit.

4. An electronic device comprising: a main body including an electronic component; a rear cover; a latch assembly comprising: a first bracket to fixedly engage with the main body; a latch to slide back and forth along the first bracket between a lock position to hold the rear cover and an unlock position to release the rear cover; an elastic member disposed between the latch and the first bracket to generate a force to the latch to hold the rear cover; and a cable having a first end connected to the latch; and a pulley disposed in the main body to change a direction of the cable, wherein the cable is to generate a pulling force to the latch to release the rear cover from the main body when the cable is pushed using an external tool; and the latch further comprises: a lock portion to hold the rear cover to lock the main body and the rear cover when the latch is in the lock position; and a hook portion to hold the rear cover in place to disengage the main body and the rear cover when the latch is in the unlock position; and the latch assembly further comprises a second bracket to fixedly engage with the rear cover, and wherein the second bracket comprises: a first portion to engage with the lock portion of the latch in the lock position; and a second portion to engage with the hook portion in the unlock position.

5. The electronic device of claim 4, wherein the latch assembly further comprises a second bracket to fixedly engage with the rear cover such that the latch is to hold the rear cover via the second bracket.

6. The electronic device of claim 4, wherein the latch assembly further comprises an actuator connected to a second end of the cable, wherein the actuator is pushed using the external tool to provide the pulling force to the latch.

7. The electronic device of claim 4, wherein the main body comprises a lock structure corresponding to an opening in the rear cover, wherein the external tool is inserted into the opening and guided through the lock structure to push the cable.

8. The electronic device of claim 7, wherein the pulley is to change a direction of movement of the cable such that the cable is to actuate the latch in a first direction when the cable is pushed using the external tool in a second direction.

9. An electronic device comprising: a main body comprising: an electronic component; and a lock structure; a rear cover; a latch assembly comprising: a first bracket to fixedly engage with the main body; a latch to slide back and forth along the first bracket between a lock position to hold the rear cover and an unlock position to release the rear cover; an elastic member disposed between the latch and the first bracket to generate a force to the latch to hold the rear cover; and a cable having a first end connected to the latch; and a pulley disposed in the main body to change a direction of the cable, wherein the cable is to generate a pulling force to the latch to release the rear cover from the main body when the cable is pushed through the lock structure using an external tool; and the latch further comprises: a lock portion to hold the rear cover to lock the main body and the rear cover when the latch is in the lock position; and a hook portion to hold the rear cover in place to disengage the main body and the rear cover when the latch is in the unlock position; and the latch assembly further comprises a second bracket to fixedly engage with the rear cover, and wherein the second bracket comprises: a first portion to engage with the lock portion of the latch in the lock position; and a second portion to engage with the hook portion in the unlock position.

10. The electronic device of claim 9, wherein the lock structure cooperates with the external tool, the lock structure comprising:
a first internal wall having a first locking slot; and
a second internal wall having a second locking slot, the second locking slot disposed adjacent to the first locking slot and the second locking slot connecting with the first locking slot, wherein the first locking slot and the second locking slot are used to be inserted by the external tool to push the cable.

11. The electronic device of claim 10, wherein the external tool comprises a Kensington lock, and wherein the first locking slot and the second locking slot comprise a Kensington locking slot that cooperates with the Kensington lock.

12. The electronic device of claim 9, wherein the latch assembly further comprises an actuator connected to a second end of the cable, wherein the actuator is pushed through the look structure using the external tool to provide the pulling force to the latch.

13. The electronic device of claim 9, wherein the rear cover comprises an opening corresponding to the lock structure such that the external tool is inserted into the opening and guided through the lock structure to push the cable.

\* \* \* \* \*